(12) United States Patent
Anway

(10) Patent No.: US 7,944,361 B2
(45) Date of Patent: May 17, 2011

(54) ELECTRIC FIELD WHISTLE

(75) Inventor: Carol E. Anway, North Bend, WA (US)

(73) Assignee: The Boeing Company, Chicago, IL (US)

( * ) Notice: Subject to any disclaimer, the term of this patent is extended or adjusted under 35 U.S.C. 154(b) by 359 days.

(21) Appl. No.: 12/272,667

(22) Filed: Nov. 17, 2008

(65) Prior Publication Data

US 2010/0123590 A1 May 20, 2010

(51) Int. Cl.
*G01W 1/00* (2006.01)
(52) U.S. Cl. ............ 340/601; 340/660; 340/691.2; 340/691.4; 340/693.5; 324/72; 324/457
(58) Field of Classification Search ............ 340/601, 340/691.2, 691.4, 693.5, 660; 324/72, 457
See application file for complete search history.

(56) References Cited

U.S. PATENT DOCUMENTS

| | | | | |
|---|---|---|---|---|
| 5,184,215 A | * | 2/1993 | Barker | 348/159 |
| 5,263,368 A | * | 11/1993 | Breitmeier et al. | 73/170.24 |
| 7,049,972 B2 | * | 5/2006 | Fabian et al. | 340/601 |

OTHER PUBLICATIONS

Sae 1999-11-0033, E-Field Detectors.
Lightning: Physics and Effects, Vladimir A. Rakov, Martin A. Uman, Cambridge University Press, 2007 ISBN 0521035414, 9780521035415, 697 Pages, Lightning and Airborne Vehicles, p. 352.

* cited by examiner

*Primary Examiner* — Tai T Nguyen
(74) *Attorney, Agent, or Firm* — Randy W. Tung

(57) ABSTRACT

In one embodiment, an electric field sensor is provided including an elongated conductor; a circuit including an input and an output connected across the elongated conductor wherein said circuit includes a DC to AC signal converter; wherein said elongated conductor is operative to impose a DC signal on said circuit input in response to being exposed to an electric field and broadcast an AC signal converted from said DC signal in response to said electric field being greater than a threshold level.

12 Claims, 3 Drawing Sheets

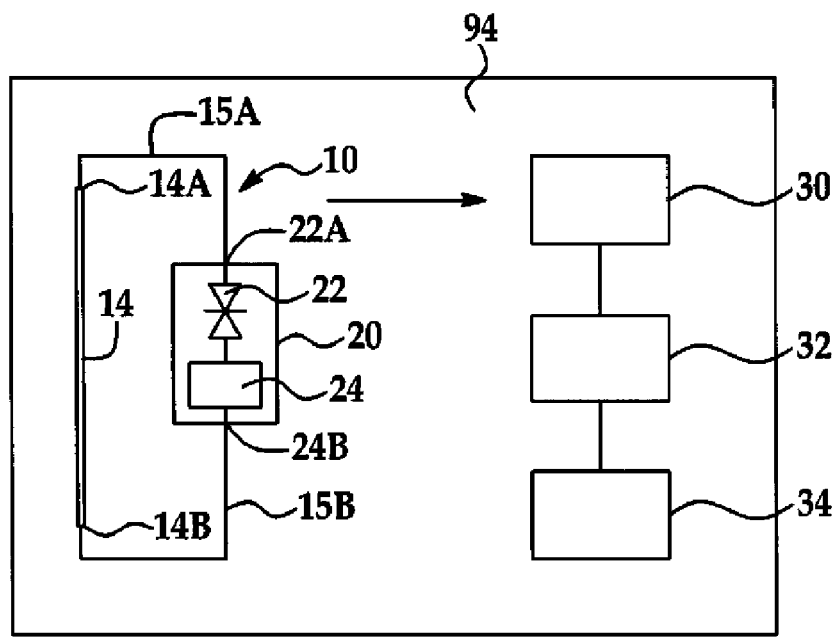
FIG. 1A
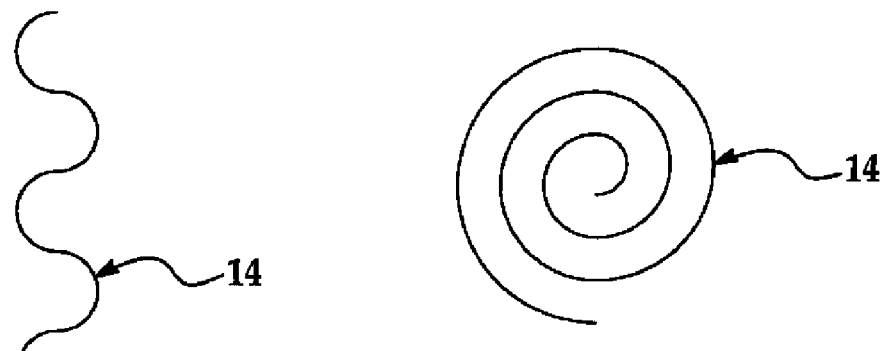
FIG. 1B
FIG. 1C
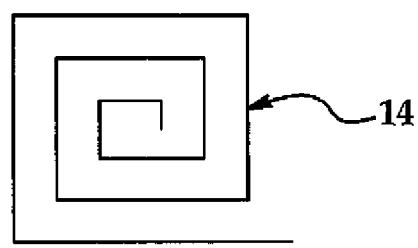
FIG. 1D
FIG. 1E ical field sensor that is combined with an antenna that operates to emit a signal (whistles) at a predetermined frequency in response to a high electric field, such as immediately prior to a lightning strike.

ELECTRIC FIELD WHISTLE

TECHNICAL FIELD

The disclosure relates to electric field sensors and more particularly to an electric field sensor that is combined with an antenna that operates to emit a signal (whistles) at a predetermined frequency in response to a high electric field, such as immediately prior to a lightning strike.

BACKGROUND

Lightning strikes are desirable to protect against, including with respect to aircraft. One method of warning of an imminent lightning strike includes measuring the strength of an electric field.

One approach in the prior art has included using electric field mills which include a spinning set of fan blades that alternately cover and uncover an anode plate that is alternately charged by the electric field when uncovered and the charge state determined followed by discharge of the anode plate when covered.

While an electric field mill gives a good absolute measure of an electric field, an electric field mill includes moving parts, such as a high rpm motor (e.g., 1650 rpm) and two metallic coaxial disks separated by a fixed distance, and therefore has the drawbacks of being bulky, complex, and sensitive to stress and wear, requiring frequent servicing.

Accordingly there is a need for an electric field sensor that overcomes at least some of the drawbacks of prior art field sensors e.g., is smaller, has few or no moving parts, and requires less or infrequent servicing.

SUMMARY

An electric field sensor (whistle) is provided that may be used to warn of an imminent lightning strike. Some action may then be taken in response. The electric field sensor may be included on an aircraft.

In one exemplary embodiment, an electric field sensor is provided including an elongated conductor; a circuit including an input and an output connected across the elongated conductor wherein the circuit includes a DC to AC signal converter; wherein the elongated conductor is operative to impose a DC signal on the circuit input in response to being exposed to an electric field and broadcast an AC signal converted from the DC signal in response to the electric field being greater than a threshold level.

In another exemplary embodiment, a lightning strike warning system is provided including one or more electric field sensors mounted on or within a skin of a vehicle, the electric field sensors each including: an elongated conductor; a circuit including an input and an output connected across the elongated conductor wherein the circuit includes a DC to AC signal converter; wherein the elongated conductor is operative to impose a DC signal on the circuit input in response to being exposed to an electric field and broadcast a radio signal converted from the DC signal in response to the electric field being greater than a threshold level; and, one or more radio signal receivers on the vehicle adapted to receive the radio signal from the one or more electric field sensors.

In another exemplary embodiment, a method of sensing and warning of an electric field is provided, the method including providing an elongated conductor; providing a circuit including an input and an output connected across the elongated conductor wherein the circuit includes a DC to AC signal converter; generating a DC signal in response to exposure of the elongated conductor to an electric field; and, broadcasting an AC signal converted from the DC signal in response to the electric field being greater than a threshold level.

In another exemplary embodiment, a method of warning of a lightning strike near a vehicle in provided, the method including providing one or more electric field sensors mounted on or within a vehicle skin, the electric field sensors each including: an elongated conductor; a circuit including an input and an output connected across the elongated conductor wherein the circuit includes a DC to AC signal converter; wherein the elongated conductor is operative to impose a DC signal on the input in response to being exposed to an electric field and broadcast a radio signal converted from the DC signal in response to the electric field being greater than a threshold level; and, providing one or more radio signal receivers on the vehicle, the one or more radio signal receivers receiving the radio signal from the one or more electric field sensors.

BRIEF DESCRIPTION OF THE ILLUSTRATIONS

Exemplary embodiments of the invention will become more fully understood from the detailed description and the accompanying drawings, wherein:

FIG. 1A is a representative implementation of the electric field whistle according to an exemplary embodiment.

FIGS. 1B-1E show exemplary antenna shapes according to exemplary embodiments.

DETAILED DESCRIPTION

Figure 2A:
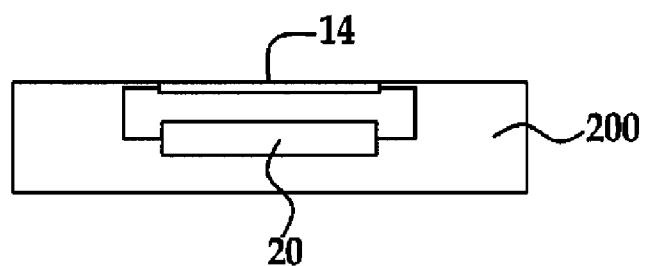
FIG. 2A is a representative implementation of the electric field whistle according to an exemplary embodiment.

The following detailed description is merely exemplary (illustrative) in nature and is not intended to limit the described embodiments or the application and the uses of the described embodiments. Furthermore, there is no intention to be bound by any expressed or implied theory presented in the disclosure.

Referring to FIG. 1A is shown an exemplary embodiment of an electric field whistle (electric field sensor) generally indicated by reference numeral 10. The electric field sensor includes an antenna 14 and a circuit 20 connected in series where an output of the antenna 14 is connected to an input of the circuit 20 and an output of the circuit 20 is connected to an input of the antenna 14. In an exemplary embodiment, the antenna 14 may include a predetermined length of an elongated conductor, such as a rod or square shaped length of metal e.g., of metal wire, or where the conductor is cylindrical or hollow at the center.

It will be appreciated that the elongated conductor may be embedded in a sheath of insulating material or that the elongated conductor may be conductor lines deposited onto a substrate, such as an insulating substrate. The elongated conductor may include any width, but in an exemplary embodiment, has a width (or diameter) of about 0.5 mm to about 10 mm.

The antenna 14 between two antenna ends 14A and 14B need not be straight. For example, the antenna 14 is preferably substantially straight as shown (e.g., rod or cylinder shaped) but it will be appreciated that the antenna 14 may include other geometrical shapes, such as wave shaped (e.g., FIG. 1B), coil shaped (e.g., FIGS. 1C, 1E), and arc shaped (e.g., FIG. 1D). It will be further be appreciated that the length of the antenna 14 will at least in part determine the frequency at which a radio frequency signal is emitted (whistles) from the antenna.

In one exemplary embodiment, the antenna may have a length from about 1 cm to about 50 cm, more preferably from about 10 cm to about 30 cm, and emits a signal (whistles) at a frequency that may range from about 140 MHz to about 7 GHz, preferably from about 235 MHz to about 700 MHz.

Still referring to FIG. 1A, a circuit 20 is electrically connected across the antenna 14 (e.g., across each end of the antenna 14). A first portion (e.g. first end) of the antenna 14A may be connected e.g., wiring 15A to an input 22A of the circuit 20 where the input is connected to a voltage dependent resistance device 22 which may be a varistor, zener diode or tranzorb (also referred to as Transzorb™) which has a high resistance at low voltage but rapidly loses resistance at high voltage. Preferably, the voltage dependent resistance device 22 includes a threshold voltage that an imposed voltage must be above in order for electrical conduction to occur.

More preferably, the voltage dependent resistance device 22 may be a tranzorb that conducts electricity in response to receiving a voltage signal having a magnitude greater than the breakdown voltage of the tranzorb. For example, the tranzorb may clamp an output voltage to its breakdown voltage. In an exemplary embodiment, the voltage dependent resistance device 22 may have a threshold voltage of from about 15 to 50 volts, more preferably from about 25 to about 35 volts.

The output from the voltage dependent resistance device 22 is output to DC to AC converter 24, which may be any conventional DC to AC converter. An output 24B from circuit 20 is then connected e.g., wiring 15B, to a second portion (e.g. second end 14B) of the antenna 14. Preferably, an output AC (radio) signal frequency of the DC to AC converter may be tuned (prior to use) to match the antenna, e.g., output a radio signal at or near the resonant frequency of the antenna, which may at least in part be determined by the length of the antenna 14. The antenna, in turn emits (broadcasts) the radio signal (whistles) at or near the frequency output by the DC to AC converter. It will be appreciated that the amplitude of the emitted radio frequency may be proportional to a magnitude of the sensed electric field (e.g., voltage at input of the circuit 20). It will further be appreciated that the antenna 14 provides the power source for the electric field whistle by virtue of its presence in a changing electric field. The antenna 14 together with circuit 20 makes up the electric field whistle (sensor) 10 according to an exemplary embodiment.

In exemplary operation of the electric field whistle, the antenna 14 senses an electric field present over the length of the antenna, such as in the presence of an electric field surrounding a vehicle (e.g. aircraft 94) such as immediately preceding a lightning strike (St. Elmo's fire). The presence of the electric field causes a DC voltage to be generated and input to the circuit 20 including tranzorb 22 which only allows a signal to pass to the DC to AC converter 24 if the voltage is above a predetermined threshold value. If the DC voltage is above the threshold value, the DC to AC converter 24 then outputs an AC radio frequency signal to the antenna 14 at a frequency matching the antenna 14, which then whistles by broadcasting a radio frequency signal. The radio signal may then be received by a radio receiver e.g., 30, which may be included in some other part of the aircraft 94 such as included in electrical systems of the aircraft, e.g., 104, shown in FIG. 5, or by some other radio receiver.

In response, a controller e.g., 32 may send a signal shutting down selected electrical system 34 in the aircraft, or issue commands causing other aircraft systems to take other action including at least one of prior to, during or following sensing of the high electric field. It will also be appreciated that individual aircraft systems may include a radio receiver/controller capability programmed to respond without the necessity of a separate receiver 30 and controller 32.

In exemplary operation, the electric field whistle is preferably able to respond e.g., sense an electric field circuit and send a radio signal on the time scale of the order of milliseconds or less, allowing a warning to be received on the aircraft within from about 1 millisecond to about 2 seconds prior to a lightning strike.

Referring to FIG. 2A, in an exemplary embodiment, the antenna 14 and/or associated circuit 20 may be embedded within an aircraft skin 200, which may include a polymer composite material such as carbon fiber reinforced polymer. For example, the antenna 14 may be made about flush with the surface of the aircraft skin to optimize sensitivity to an electric field outside the aircraft, e.g., such as a high electric field (St. Elmo's Fire) present immediately prior to a lightning strike. It will be appreciated that the antenna 14 and/or associated circuit 20 may be mounted on a separate substrate, which may in turn be mounted on or embedded within the aircraft skin.

Figure 2B:
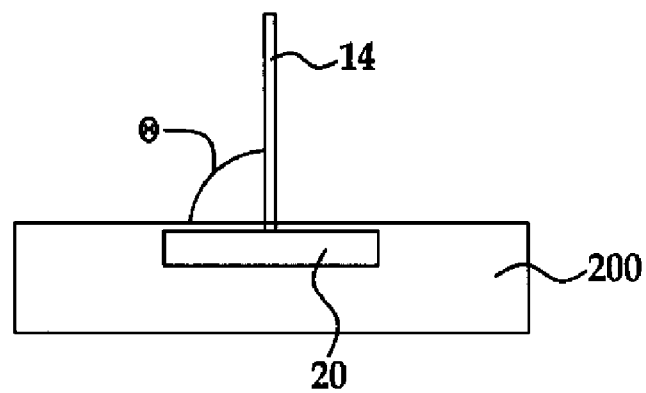
FIG. 2B is a representative implementation of the electric field whistle according to an exemplary embodiment.

In another exemplary embodiment, Referring to FIG. 2B, the electric field whistle may have the antenna 14 and associated circuit 20 arranged such that the antenna 14 protrudes outward with respect to the aircraft skin 200, e.g., makes an angle theta θ of 90 degrees or less with respect to the surface of the aircraft skin. For example, the antenna may include wiring to a protruding end by including a sheath conductor insulated from the antenna 14 as wiring, similar to coaxial cable, where the core conductor is the antenna.

Figure 3:
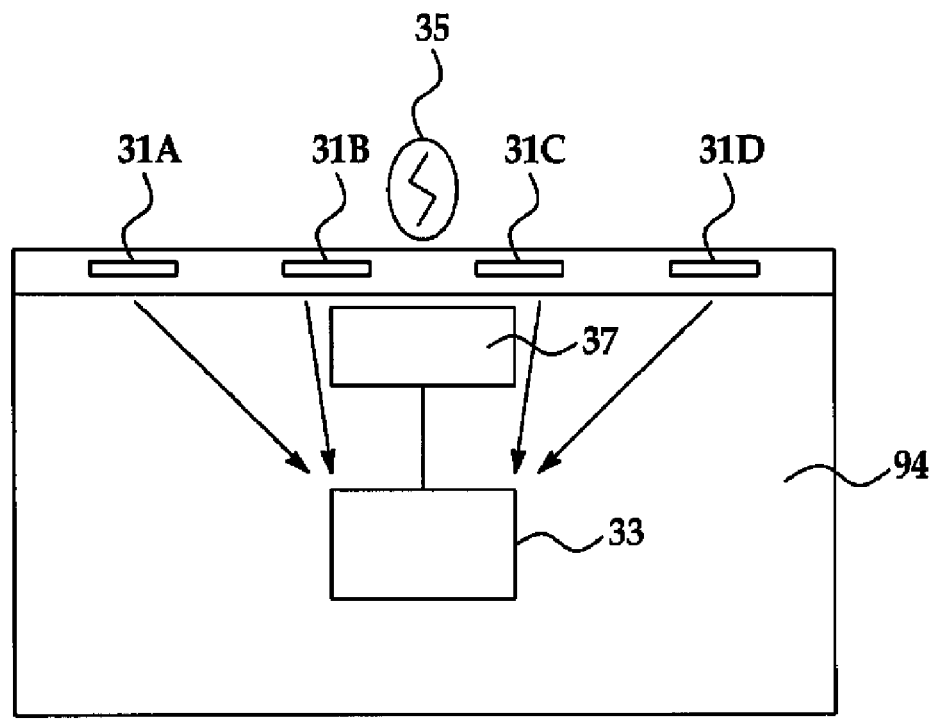
FIG. 3 is a representative implementation of a plurality of electric field whistles according to an exemplary embodiment.

In another exemplary embodiment, referring to FIG. 3, the aircraft may include a plurality of electric field whistles e.g., 31A, 31B, 31C, 31D in different parts of the aircraft 94 that are in radio communication (via whistling RF shown by arrows) with a receiver/controller 33 that may be programmed to predict a particular location e.g., 35 where a lightning strike may occur with respect to the aircraft.

For example, by comparing the relative amplitudes of a plurality of electric field whistles, each of which emit an RF signal at a different frequency (e.g., have a different length) in response to a sensed electric field, and where the amplitude of the emitted RF signals are proportional to the magnitude of the sensed electric field, receiver/controller 33 may be programmed to determine properties of the electric field e.g., where the electric field is most intense, and thereby predict a location where lightning strike is most likely. In response to a predicted location of a lightning strike, e.g., 35, action may then be taken by receiver/controller 33, such as shutting down sensitive electrical systems e.g., 37 in a particular area of an aircraft proximate to the predicted location of a lightning strike.

Figure 4:
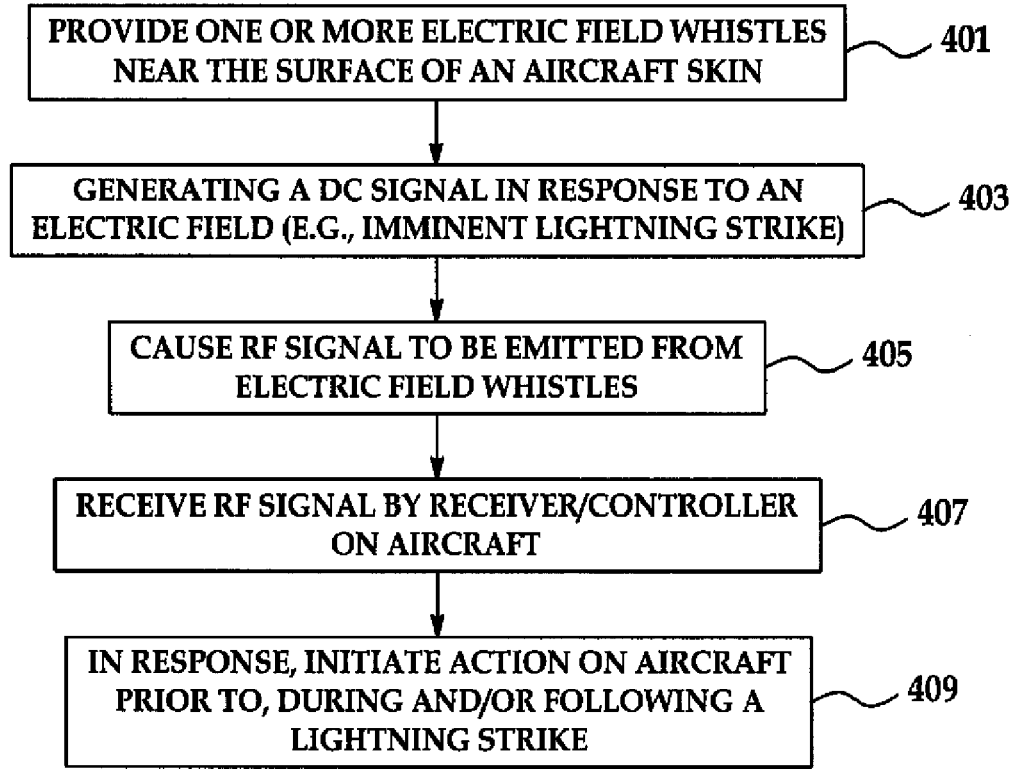
FIG. 4 is a representative implementation of a method of using the electric field whistle according to an exemplary embodiment.

Referring to FIG. 4, is shown an exemplary method of operation of the electric field sensors. In step 401, one or more electric field whistles are provided near the surface of an aircraft skin. In step 403, the one or more electric field whistles are exposed to a high electric field, such as that present from an imminent lightning strike, and generate an electric field in response. In step 405, in response, each of the one or more electric field whistles emits (whistles at) a respective RF signal. In step 407, in response, one or more RF signal receivers on the aircraft receive the RF signal. In step 409, in response, action is taken in at least one of before, during, and following a lightning strike.

Figure 5:
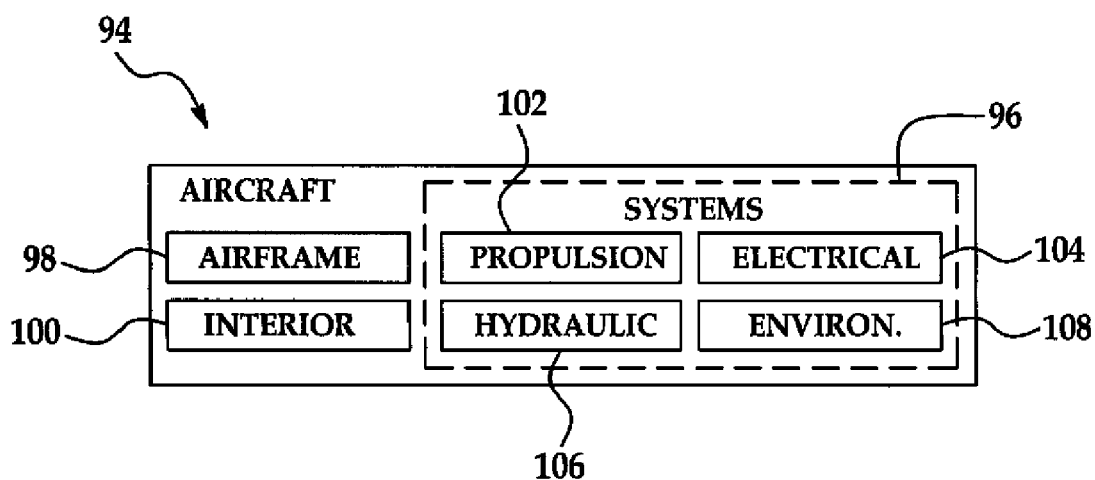
FIG. 5 is a representative implementation of an aircraft using the electric field whistle according to an exemplary embodiment.

As shown in FIG. 5, the aircraft 94 may include an airframe 98 with a plurality of systems 96 and an interior 100. Examples of high-level systems 96 include one or more of a propulsion system 102, an electrical system 104, a hydraulic system 106, and an environmental system 108. Any number of other systems may be included. Although an aerospace example is shown, the principles of the invention may be applied to other industries, such as the automotive industry.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A lightning strike warning system comprising:
    one or more electric field sensors mounted on or within a skin of a vehicle, said electric field sensors each comprising:
        an elongated conductor;
        a circuit comprising an input and an output connected across the elongated conductor wherein said circuit comprises a DC to AC signal converter;
        wherein said elongated conductor is operative to impose a DC signal on said circuit input in response to being exposed to an electric field and broadcast a radio signal converted from said DC signal in response to said electric field being greater than a threshold level; and,
    one or more radio signal receivers on said vehicle adapted to receive said radio signal from said one or more electric field sensors.

2. The lightning strike warning system of claim 1, further comprising a controller in communication with said one or more radio signal receivers, said controller adapted to control one or more vehicle systems in response to said receiver receiving said radio signal.

3. The lightning strike warning system of claim 1, wherein said one or more electric field sensors comprises a plurality of electric field sensors, each electric field sensor adapted to broadcast said radio signal at a different frequency.

4. The lightning strike warning system of claim 3, further comprising a controller in communication with said one or more radio signal receivers, said controller adapted to predict a location of a lightning strike based on radio signals broadcast from said one or more electric field sensors.

5. The lightning strike warning system of claim 4, wherein said controller is further adapted to control one or more vehicle systems in response to said predicted location of said lightning strike.

6. The lightning strike warning system of claim 1, wherein said vehicle is an aircraft.

7. A method of warning of a lightning strike near a vehicle comprising:
    providing one or more electric field sensors mounted on or within a vehicle skin, said electric field sensors each comprising:
        an elongated conductor;
        a circuit comprising an input and an output connected across the elongated conductor wherein said circuit comprises a DC to AC signal converter;
        wherein said elongated conductor is operative to impose a DC signal on said input in response to being exposed to an electric field and broadcast a radio signal converted from said DC signal in response to said electric field being greater than a threshold level; and,
    providing one or more radio signal receivers on said vehicle, said one or more radio signal receivers receiving said radio signal from said one or more electric field sensors.

8. The method of claim 7, further comprising controlling one or more vehicle systems in response to said receiver receiving said radio signal.

9. The method of claim 8, further comprising predicting a location of a lightning strike based on radio signals broadcast from said one or more electric field sensors.

10. The method of claim 9, further comprising controlling one or more vehicle systems in response to said predicted location of said lightning strike.

11. The method of claim 7, wherein said one or more electric field sensors comprises a plurality of electric field sensors, each electric field sensor broadcasting said radio signal at a different frequency.

12. The method of claim 7, wherein said vehicle is an aircraft.

* * * * *